(12) United States Patent
Das et al.

(10) Patent No.: US 7,572,741 B2
(45) Date of Patent: Aug. 11, 2009

(54) METHODS OF FABRICATING OXIDE LAYERS ON SILICON CARBIDE LAYERS UTILIZING ATOMIC OXYGEN

(75) Inventors: Mrinal K. Das, Durham, NC (US); Anant K. Agarwal, Chapel Hill, NC (US); John W. Palmour, Cary, NC (US); Dave Grider, Durham, NC (US)

(73) Assignee: Cree, Inc., Durham, NC (US)

( * ) Notice: Subject to any disclaimer, the term of this patent is extended or adjusted under 35 U.S.C. 154(b) by 496 days.

(21) Appl. No.: 11/229,476

(22) Filed: Sep. 16, 2005

(65) Prior Publication Data
US 2009/0004883 A1    Jan. 1, 2009

(51) Int. Cl.
*H01L 21/31* (2006.01)
*H01L 21/469* (2006.01)

(52) U.S. Cl. ........................ 438/765; 438/787; 438/931; 257/E21.055

(58) Field of Classification Search .......... 257/E21.055; 438/788, 792, 765, 787, 931
See application file for complete search history.

(56) References Cited

U.S. PATENT DOCUMENTS

| | | | |
|---|---|---|---|
| 4,560,409 A | 12/1985 | Goldberger et al. | |
| 4,689,104 A | 8/1987 | Lavendel et al. | |
| 4,692,388 A | 9/1987 | Lavendel et al. | |
| 4,778,726 A | 10/1988 | Lavendel et al. | |
| 4,806,431 A | 2/1989 | Lavendel et al. | |
| 4,810,532 A | 3/1989 | Lavendel et al. | |
| 4,818,625 A | 4/1989 | Lavendel et al. | |
| 4,894,511 A | 1/1990 | Caledonia et al. | |
| 4,910,436 A | 3/1990 | Collins | |
| 5,041,361 A | 8/1991 | Tsuo | |
| 5,246,741 A * | 9/1993 | Ouhata et al. | 427/524 |

(Continued)

FOREIGN PATENT DOCUMENTS

EP    1463121    9/2004

(Continued)

OTHER PUBLICATIONS

Schmidt, Lanny, The Engineering of Chemical Reactions, 2d Edition, pp. 275-276, Oxford University Press, 2005.*

(Continued)

*Primary Examiner*—Matthew C Landau
*Assistant Examiner*—Daniel Luke
(74) *Attorney, Agent, or Firm*—Myers Bigel Sibley & Sajovec

(57) ABSTRACT

Methods of forming oxide layers on silicon carbide layers are disclosed, including placing a silicon carbide layer in a chamber such as an oxidation furnace tube that is substantially free of metallic impurities, heating an atmosphere of the chamber to a temperature of about 500 ° C. to about 1300 ° C., introducing atomic oxygen in the chamber, and flowing the atomic oxygen over a surface of the silicon carbide layer to thereby form an oxide layer on the silicon carbide layer. In some embodiments, introducing atomic includes oxygen providing a source oxide in the chamber and flowing a mixture of nitrogen and oxygen gas over the source oxide. The source oxide may comprise aluminum oxide or another oxide such as manganese oxide. Some methods include forming an oxide layer on a silicon carbide layer and annealing the oxide layer in an atmosphere including atomic oxygen.

17 Claims, 10 Drawing Sheets

U.S. PATENT DOCUMENTS

| | | | |
|---|---|---|---|
| 5,259,885 | A | 11/1993 | Sandhage |
| 5,332,597 | A | 7/1994 | Carolan et al. |
| 5,332,619 | A | 7/1994 | Lacoste et al. |
| 5,415,756 | A | 5/1995 | Wolfe et al. |
| 5,427,823 | A | 6/1995 | Varshney et al. |
| 5,443,863 | A | 8/1995 | Neely et al. |
| 5,580,643 | A | 12/1996 | Kennedy et al. |
| 5,585,165 | A | 12/1996 | Kennedy et al. |
| 5,670,798 | A | 9/1997 | Schetzina |
| 5,679,965 | A | 10/1997 | Schetzina |
| 5,682,594 | A | 10/1997 | Kennedy et al. |
| 5,683,797 | A | 11/1997 | Carolan et al. |
| 5,741,596 | A | 4/1998 | Skowronski et al. |
| 5,753,934 | A | 5/1998 | Yano et al. |
| 5,766,789 | A | 6/1998 | James et al. |
| 5,801,105 | A | 9/1998 | Yano et al. |
| 5,807,441 | A | 9/1998 | Tomida et al. |
| 5,810,923 | A | 9/1998 | Yano et al. |
| 5,828,080 | A | 10/1998 | Yano et al. |
| 5,842,088 | A | 11/1998 | Thompson |
| 5,916,697 | A | 6/1999 | Lagues |
| 5,919,515 | A | 7/1999 | Yano et al. |
| 5,955,213 | A | 9/1999 | Yano et al. |
| 5,990,440 | A | 11/1999 | Yamaguchi et al. |
| 6,046,464 | A | 4/2000 | Schetzina |
| 6,082,375 | A | 7/2000 | Gealy et al. |
| 6,096,434 | A | 8/2000 | Yano et al. |
| 6,121,647 | A | 9/2000 | Yano et al. |
| 6,149,829 | A | 11/2000 | Takamatsu et al. |
| 6,194,036 | B1 | 2/2001 | Babayan et al. |
| 6,228,453 | B1 | 5/2001 | Fareed et al. |
| 6,248,618 | B1 | 6/2001 | Quek et al. |
| 6,387,712 | B1 | 5/2002 | Yano et al. |
| 6,413,640 | B1 | 7/2002 | Hanzawa et al. |
| 6,451,485 | B1 | 9/2002 | James et al. |
| 6,509,283 | B1 * | 1/2003 | Thomas ............ 438/787 |
| 6,534,754 | B2 | 3/2003 | Schulz et al. |
| 6,551,939 | B2 | 4/2003 | Takamatsu et al. |
| 6,566,210 | B2 | 5/2003 | Ajmera et al. |
| 6,579,465 | B1 | 6/2003 | Takamatsu et al. |
| 6,579,636 | B2 | 6/2003 | Oguri et al. |
| 6,599,814 | B1 | 7/2003 | Vanhaulemeersch et al. |
| 6,610,211 | B1 | 8/2003 | Gealy et al. |
| 6,613,697 | B1 | 9/2003 | Faur et al. |
| 6,657,385 | B2 | 12/2003 | Tomasetti et al. |
| 6,768,574 | B2 | 7/2004 | Seria et al. |
| 6,787,229 | B1 | 9/2004 | Muradov |
| 6,806,501 | B2 | 10/2004 | Vanhaulemeersch et al. |
| 6,846,754 | B2 | 1/2005 | Udagawa et al. |
| 6,939,756 | B1 * | 9/2005 | Chung et al. ............ 438/198 |
| 2002/0073925 | A1 * | 6/2002 | Noble et al. ............ 118/723 ME |
| 2002/0079506 | A1 | 6/2002 | Komoto et al. |
| 2002/0079523 | A1 | 6/2002 | Zheng et al. |
| 2002/0088985 | A1 | 7/2002 | Komoto |
| 2002/0114980 | A1 | 8/2002 | Gunsel |
| 2002/0115285 | A1 | 8/2002 | Wong |
| 2002/0142585 | A1 | 10/2002 | Mandal |
| 2002/0153360 | A1 | 10/2002 | Yamazaki et al. |
| 2002/0179921 | A1 | 12/2002 | Cohn |
| 2002/0182785 | A1 | 12/2002 | Miyairi |
| 2002/0182828 | A1 | 12/2002 | Asami et al. |
| 2002/0187594 | A1 | 12/2002 | Yamazaki |
| 2002/0197778 | A1 | 12/2002 | Kasahara |
| 2002/0197849 | A1 | 12/2002 | Mandal |
| 2003/0008442 | A1 | 1/2003 | Alok et al. |
| 2003/0013280 | A1 | 1/2003 | Yamanaka |
| 2003/0045082 | A1 | 3/2003 | Eldridge |
| 2003/0047280 | A1 | 3/2003 | Takayam |
| 2003/0059986 | A1 | 3/2003 | Shibata |
| 2003/0080100 | A1 | 5/2003 | Yamazaki |
| 2003/0081945 | A1 | 5/2003 | Kusuda |
| 2003/0087513 | A1 | 5/2003 | Noguchi |
| 2003/0089690 | A1 | 5/2003 | Yamazaki |
| 2003/0098482 | A1 | 5/2003 | Zheng |
| 2003/0108777 | A1 | 6/2003 | Gunsel |
| 2003/0114000 | A1 | 6/2003 | Noguchi |
| 2003/0124764 | A1 | 7/2003 | Yamazaki |
| 2003/0125225 | A1 | 7/2003 | Xu |
| 2003/0136988 | A1 | 7/2003 | Zheng |
| 2003/0141504 | A1 | 7/2003 | Kuwabara |
| 2003/0141521 | A1 | 7/2003 | Isobe |
| 2003/0143398 | A1 * | 7/2003 | Ohki et al. ............ 428/398 |
| 2003/0148401 | A1 | 8/2003 | Agrawal |
| 2003/0168437 | A1 | 9/2003 | Tanaka |
| 2003/0183160 | A1 | 10/2003 | Fujikura |
| 2003/0196680 | A1 | 10/2003 | Lee |
| 2003/0211728 | A1 | 11/2003 | Mandal |
| 2003/0218171 | A1 | 11/2003 | Isobe |
| 2003/0223280 | A1 | 12/2003 | Okumura |
| 2003/0228723 | A1 | 12/2003 | Yamazaki |
| 2003/0232494 | A1 | 12/2003 | Adams |
| 2004/0023253 | A1 | 2/2004 | Kunwar |
| 2004/0055539 | A1 | 3/2004 | Lee |
| 2004/0057761 | A1 | 3/2004 | Ito |
| 2004/0077156 | A1 | 4/2004 | Tsakalakos et al. |
| 2004/0129673 | A1 * | 7/2004 | Belyansky et al. ............ 216/67 |
| 2004/0157436 | A1 | 8/2004 | Wong |
| 2004/0185301 | A1 | 9/2004 | Tsuchiya |
| 2004/0188688 | A1 | 9/2004 | Muranaka |
| 2004/0206730 | A1 | 10/2004 | Holber |
| 2004/0224486 | A1 | 11/2004 | Ichijo |
| 2004/0235291 | A1 | 11/2004 | Mandal |
| 2004/0255862 | A1 | 12/2004 | Lee |
| 2004/0263740 | A1 | 12/2004 | Sakakura |
| 2005/0000434 | A1 | 1/2005 | Lee |
| 2005/0000435 | A1 | 1/2005 | Lee |
| 2005/0020037 | A1 | 1/2005 | Asami |
| 2005/0023603 | A1 | 2/2005 | Eldridge |
| 2005/0179959 | A1 | 8/2005 | Lien |
| 2005/0192791 | A1 | 9/2005 | Mayer |
| 2005/0216697 | A1 | 9/2005 | Liron et al. |

FOREIGN PATENT DOCUMENTS

| | | |
|---|---|---|
| JP | 2004-031864 | 1/2004 |
| WO | WO 03/003435 | 1/2003 |

OTHER PUBLICATIONS

Allerstam et al. "High Field-Effect Mobility in 6H-MOSFET with Gate Oxides Grown in Alumina Environment" *Materials Science forum* vols. 483-485, pp. 837-840 (2005).

Hoff et al. "Afterglow Thermal Oxidation of Silicon Carbide" *Mat. Res. Soc. Symp. Proc.* vol. 742, p. K4.7.1-K4.7.6 (2003).

International Search Report and Written Opinion of the International Searching Authority for corresponding International Application No. PCT/US2006/027198, mailed Dec. 4, 2006.

Kosugi et al. "Reduction of Interface Trapped Density of $SiO_2$/4H-SiC by Oxidation of Atomic Oxygen" *Materials Science Forum* vols. 433-436, pp. 563-566 (2003).

Kosugi et al. "Thermal Oxidation of (0001) 4H-SiC at High Temperatures in Ozone-Admixed Oxygen Gas Ambient" *Applied Physics Letters* 83(5), 2003.

Chung et al. "Effect of Nitric Oxide Annealing on the Interface Trap Densities Near the Band Edges in the 4H Polytype of Silicon Carbide" *Applied Physics Letters* 76(13): 1713-1715 (2000).

Chung et al. "Improved Inversion Channel Mobility for 4H-SiC MOSFETs Following High Temperature Anneals in Nitric Oxide" *IEEE Electron Device Letters Accepted for Publication* (2001).

Das "Fundamental Studies of the Silicon Carbide MOS Structure" Doctoral Thesis, Purdue University, Dec. 1999.

Das et al. "High Mobility 4H-SiC Inversion Mode SOFETs Using Thermally Grown, NO Annealed $SiO_2$" *IEEE Device Research Conference*, Denver, Co Jun. 19-21, 2000.

Gudjonsson et al. "Enhancement of inversion Channel Mobility in 4H-SiC MOSFETs using a Gate Oxide Grown in Nitrous Oxide" *Materials Science Forum* 457-460 p. 1425 (2004).

Lai et al. "Effects of Nitridation and Annealing on Interface Properties of Thermally Oxidized SiO2/SiC Metal-Oxide-Semiconductor System" *Applied Physics Letters* 76(25): 3744-3746 (2000).

Ólafsson "Detection and Removal of Traps at the $SiO_2$/SiC Interface" pp. i-74 *Thesis for the Degree of Doctor of Philosophy*, Chalmers University of Technology, Goteborg, Sweden (2004).

Ólafsson et al. "High Field Effect Electron Mobility in Si Face 4H-SiC MOSFET" *Electronics Letters* 40 p. 508 (2004).

Suzuki et al. "Effect of Post-oxidation annealing in Hydrogen on SiO2/4H-SiC Interface" *Material Sicence Forum* vols. 338-342 pp. 1073-1076 (2000).

Xu et al. "Improved Performance and Reliability of N2O-Grown Oxynitride on 6H-SiC" *IEEE Electron Device Letters* 21(6): 298-300 (2000).

\* cited by examiner

METHODS OF FABRICATING OXIDE LAYERS ON SILICON CARBIDE LAYERS UTILIZING ATOMIC OXYGEN

STATEMENT OF GOVERNMENT INTEREST

The present invention was made, at least in part, with support from United States Air Force contract number FA8650-04-2-2410. The Government may have certain rights in this invention.

FIELD OF THE INVENTION

The present invention relates to the fabrication of semiconductor devices and more particularly, to the fabrication of oxide layers on silicon carbide (SiC).

BACKGROUND

Silicon carbide (SiC) has a combination of electrical and physical properties that make it attractive for a semiconductor material for high temperature, high voltage, high frequency and high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

Silicon carbide has the unique property among wide bandgap compound semiconductor materials that it forms a native oxide. Thus, a thermal $SiO_2$ layer may be formed on a SiC layer. The ability to form a thermal oxide on SiC opens the door for the formation of metal-oxide-semiconductor (MOS) devices using silicon carbide, including, for example, MOS field-effect transistors (MOSFETs), MOS capacitors, insulated gate bipolar transistors (IGBT's), MOS-controlled thyristors (MCTs), lateral diffused MOSFETs (LDMOSFETs) and other related devices. Given the unique material properties of SiC described above, such devices may have substantially better theoretical operating characteristics compared to devices formed using other semiconductor materials, particularly for applications requiring high power, high current capacity, and/or high frequency operation. Accordingly, taking full advantage of SiC's electronic properties in MOS devices and resulting integrated circuits requires appropriate SiC oxidation technology.

The interface quality of $SiO_2$ thermally grown on a silicon substrate may be excellent. However, the quality of thermally grown $SiC/SiO_2$ interfaces has not achieved the same levels as that of $Si/SiO_2$ interfaces. Accordingly, the quality of oxides on silicon carbide (SiC) has been a major obstacle to developing commercially viable silicon carbide MOS devices. Indeed, with the recent improvements in SiC crystal quality, oxide quality may perhaps be the largest barrier to the realization of commercially viable SiC MOS power devices and integrated circuits.

Oxides on SiC have been widely reported to have unacceptably high densities of interface states (or "traps") and fixed oxide charges, both of which may have an adverse effect on MOS device performance. As used herein, the term "state" or "trap" refers to an available energy level position within the bandgap of a semiconductor or insulator material. An interface trap or state may be located at or near a semiconductor/insulator interface. Interface states may occur due to the presence of dangling or unterminated atomic bonds within a material. Thus, the density of electronic states at an interface may be an indication of the amount of crystallographic disorder at the interface.

Interface traps may capture electronic charge carriers (i.e. electrons and/or holes), which may produce undesired operating characteristics in devices incorporating the interface. In particular, electronic states present at the $SiC/SiO_2$ interface may reduce surface electron mobility in the SiC layer. If the gate oxide of a MOS device has a high density of interface states, the resulting device may have reduced inversion channel mobility, increased threshold voltage, increased on-resistance and/or other undesirable characteristics.

Recently, annealing of a thermal oxide in a nitric oxide (NO) ambient has shown promise in a planar 4H-SiC MOSFET structure not requiring a p-well implant. See M. K. Das, L. A. Lipkin, J. W. Palmour, G. Y. Chung, J. R. Williams, K. McDonald, and L. C. Feldman, "High Mobility 4H-SiC Inversion Mode MOSFETs Using Thermally Grown, NO Annealed $SiO_2$," IEEE Device Research Conference, Denver, Colo., Jun. 19-21, 2000 and G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H-SiC MOSFETs Following High Temperature Anneals in Nitric Oxide," IEEE Electron Device Letters accepted for publication, the disclosures of which are incorporated by reference as if set forth fully herein. This anneal is shown to significantly reduce the interface state density near the conduction band edge, as described in G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713-1715, March 2000, the disclosure of which is incorporated herein as if set forth fully. High electron mobility (35-95 $cm^2/Vs$) is obtained in the surface inversion layer due to the improved MOS interface.

Unfortunately, NO is a health hazard having a National Fire Protection Association (NFPA) health danger rating of 3, and the equipment in which post-oxidation anneals are typically performed is open to the atmosphere of the cleanroom. They are often exhausted, but the danger of exceeding a safe level of NO contamination in the room is not negligible.

Growing the oxide in $N_2O$ is possible as described in J. P. Xu, P. T. Lai, C. L. Chan, B. Li, and Y. C. Cheng, "Improved Performance and Reliability of $N_2O$-Grown Oxynitride on 6H-SiC," IEEE Electron Device Letters, Vol. 21, No. 6, pp. 298-300, June 2000, the disclosure of which is incorporated by reference as if set forth fully herein. Xu et al. describe oxidizing SiC at 1100° C. for 360 minutes in a pure $N_2O$ ambient and annealing in $N_2$ for 1 hour at 1100° C.

Post-growth nitridation of the oxide on 6H-SiC in $N_2O$ at a temperature of 1100° C. has also been investigated by P. T. Lai, Supratic Chakraborty, C. L. Chan, and Y. C. Cheng, "Effects of nitridation and annealing on interface properties of thermally oxidized $SiO_2/SiC$ metal-oxide-semiconductor system," Applied Physics Letters, Vol. 76, No. 25, pp. 3744-3746, June 2000 (hereinafter, "Lai et al."), the disclosure of which is incorporated by reference as if set forth fully herein. However, Lai et al. concluded that such treatment deteriorates the interface quality which may be improved with a subsequent wet or dry anneal in $O_2$ which may repair the damage induced by nitridation in $N_2O$. Moreover, even with a subsequent $O_2$ anneal, Lai et al. did not see any significant reduction in interface state density as compared to the case without nitridation in $N_2O$.

In addition to NO and $N_2O$ growth and annealing, research has also been conducted on post growth anneals in other environments. For example, Suzuki et al. investigated post oxidation annealing in hydrogen. Suzuki et al., "Effect of Post-oxidation-annealing in Hydrogen on SiO$_2$/4H-SiC Interface," Material Science Forum, Vols. 338-342, pp. 1073-1076, 2000. These researchers reported that flat-band voltage shift and interface state density could be improved by post oxidation annealing in both argon and hydrogen. In this research, 4H-SiC was oxidized in dry O$_2$ at 1200° C. Post oxidation annealing was then carried out in argon or hydrogen for 30 minutes at 400, 700, 800 and 1000° C. Other researchers, however, have reported that post oxidation anneals in hydrogen provide no increased benefit over post oxidation anneals in other gases, as described in Mrinal Das, "Fundamental Studies of the Silicon Carbide MOS Structure," Doctoral Thesis, Purdue University, submitted December, 1999.

SUMMARY

Embodiments of the present invention provide methods of forming oxide layers on silicon carbide layers, including placing a silicon carbide layer in a chamber such as an oxidation furnace tube that is substantially free of metallic impurities; heating an atmosphere of the chamber to a temperature of about 500° C. to about 1300° C.; introducing atomic oxygen in the chamber; and flowing the atomic oxygen over a surface of the silicon carbide layer to thereby form an oxide layer on the silicon carbide layer. In some embodiments, introducing atomic oxygen includes providing a source oxide in the chamber and flowing a mixture of nitrogen and oxygen gas over the source oxide. The source oxide may include aluminum oxide or another oxide such as manganese oxide.

In some embodiments, the source oxide is substantially free of metallic impurities. For example, the source oxide may include a porous sapphire wafer. In such case, some embodiments according to the invention include implanting a sapphire wafer with non-metallic impurities to form a porous sapphire wafer, and placing the porous sapphire wafer in the chamber.

In some embodiments, introducing atomic oxygen includes generating atomic oxygen using a catalyst such as platinum. In some embodiments, introducing atomic oxygen includes generating a flow of ozone and cracking the ozone to produce atomic oxygen. Ozone may be cracked using thermal and/or electromagnetic energy.

In some embodiments, atomic oxygen may be generated outside the chamber and supplied to the chamber.

In particular embodiments, the atmosphere of the chamber may be heated to a temperature of about 1000° C. to 1100° C.

Methods of forming an oxide layer on a silicon carbide layer according to some embodiments of the invention include placing a silicon carbide layer in an oxidation chamber, placing an alumina wafer in the chamber, heating an atmosphere of the chamber to a temperature of about 500° C. to about 1300° C., flowing nitrogen gas over the alumina wafer to generate atomic oxygen in the chamber, and flowing the atomic oxygen over a surface of the silicon carbide layer to thereby form an oxide layer on the silicon carbide layer. In particular embodiments, the atmosphere of the chamber may be heated to a temperature of about 1000° C. to 1100° C. Further, oxygen gas may be flowed over the alumina wafer. In such case, methods according to embodiments of the invention may further include reacting the atomic oxygen with oxygen gas to produce ozone, flowing the ozone over the alumina wafer, and cracking the ozone to produce atomic oxygen in the vicinity of the silicon carbide layer.

Still further embodiments according to the invention include placing a silicon carbide layer in a chamber, placing an alumina wafer in the chamber, heating an atmosphere of the chamber to a temperature of about 500° C. to about 1300° C., nitriding the alumina wafer to liberate atomic oxygen, and flowing the atomic oxygen over a surface of the silicon carbide layer to thereby form an oxide layer on the silicon carbide layer. In particular further embodiments, the atmosphere of the chamber may be heated to a temperature of about 1000° C. to 1100° C. Further, oxygen gas may be flowed over the alumina wafer. In such case, methods according to embodiments of the invention may further include reacting the atomic oxygen with oxygen gas to produce ozone, flowing the ozone over the alumina wafer, and cracking the ozone to produce atomic oxygen in the vicinity of the silicon carbide layer.

In some embodiments, since source oxide wafers may be oriented in a vertical direction parallel to the orientation of the silicon carbide layers such that a substantially uniform distance between the source oxide wafers and the SiC layers is provided, which may result in improved oxide uniformity. Stated differently, the silicon carbide layers and the source oxide wafers may be arranged such that the major surfaces of respective source oxide wafers are oriented parallel to the silicon carbide layers, such that respective points on the surface of a silicon carbide layer are located equidistant from respective points on the major surface of an adjacent source oxide wafer.

Further embodiments of the invention include forming an oxide layer on a SiC layer according to conventional techniques and annealing the formed oxide layer in an ambient containing atomic oxygen. For example, methods of forming an oxide layer on a silicon carbide layer according to some embodiments of the invention include forming an oxide layer on a silicon carbide layer, placing the silicon carbide layer with the oxide layer formed thereon in a chamber substantially free of metallic impurities; heating an atmosphere of the chamber to a temperature of about 500° C. to about 1300° C.; introducing atomic oxygen in the chamber, and flowing the atomic oxygen over a surface of the silicon carbide layer with the oxide layer formed thereon. The oxide layer may be formed by a thermal process and/or a deposition process.

Introducing atomic oxygen may include providing a source oxide in the chamber and flowing a mixture of nitrogen and oxygen gas over the source oxide. The source oxide may include aluminum oxide or another oxide such as manganese oxide. In some embodiments, the source oxide is substantially free of metallic impurities. For example, the source oxide may include a porous sapphire wafer. In such case, some embodiments according to the invention include implanting a sapphire wafer with non-metallic impurities to form a porous sapphire wafer, and placing the porous sapphire wafer in the chamber.

DETAILED DESCRIPTION OF EMBODIMENTS ACCORDING TO THE INVENTION

Figure 1A:
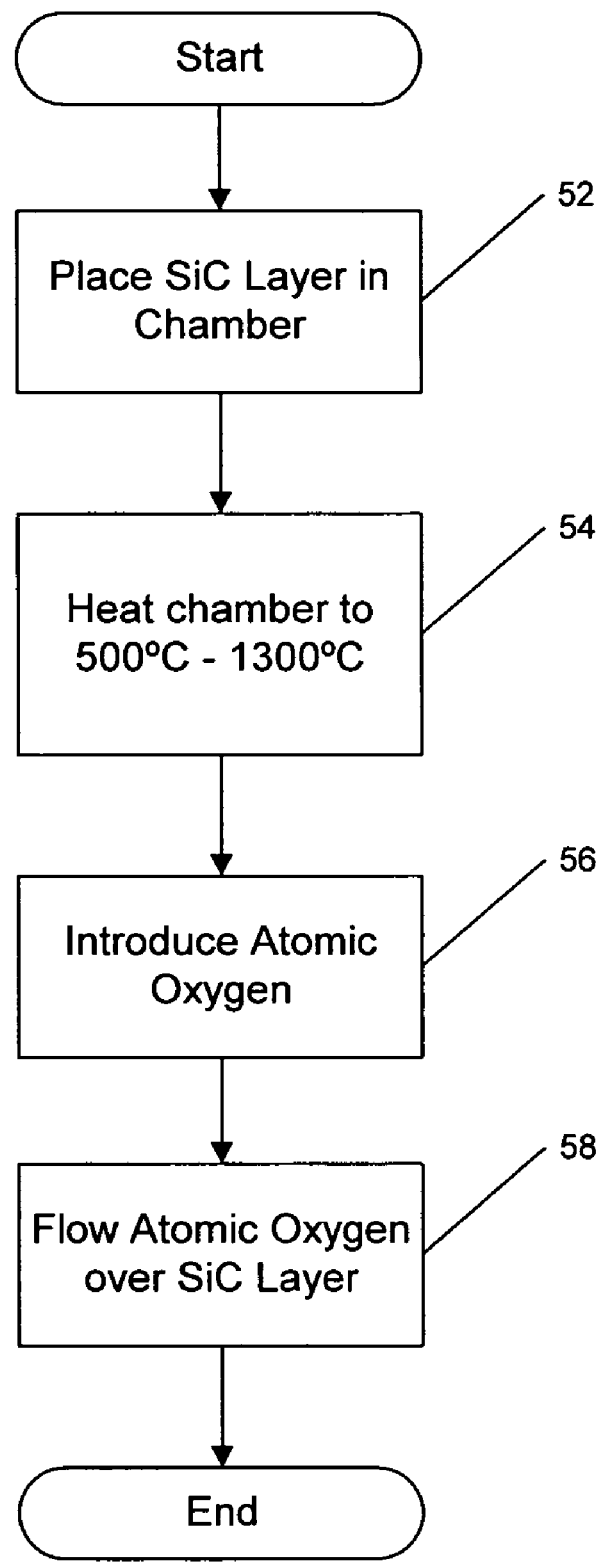
FIGS. 1A-1C are flowcharts illustrating processing steps for forming oxide layers on silicon carbide layers according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

As used herein, the term "and/or" includes any and all combinations of one or more of the associated listed items. It will be understood that, although the terms first, second, third etc. may be used herein to describe various elements, components, regions, materials, layers and/or sections, these elements, components, regions, layers and/or sections should not be limited by these terms. These terms are only used to distinguish one element, component, region, layer, material or section from another element, component, region, layer, material or section. Thus, a first element, component, region, layer, material or section discussed below could be termed a second element, component, region, layer, material or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the present invention provide methods which may enable the formation of an oxide layer on a SiC layer having an improved interface. These methods may be especially advantageous in the fabrication of Metal-Oxide-Semiconductor (MOS) devices created on SiC layers. Using embodiments of the present invention, interface states with energy levels near the conduction band of SiC may be dramatically reduced. Reduction of such defects may be advantageous, because these defects may limit a MOS device's effective surface channel mobility. In addition, the flatband voltage of MOS devices (i.e. the voltage at which no band bending occurs in the device) may be reduced using embodiments of the invention.

Thermal oxidation involves the growth of an $SiO_2$ layer on a silicon-containing semiconductor layer. As with the thermal oxidation of Si, in thermal oxidation of SiC, a portion of the underlying semiconductor layer is "consumed" by the growing oxide layer. As the layer grows, oxygen may diffuse through the growing oxide layer and react with Si at the SiC surface to form new $SiO_2$ molecules. Thus, the growth interface advances into the SiC layer as the $SiO_2$ layer is grown.

Conventional oxidation of SiC with molecular oxygen (either $O_2$ or $H_2O$) to produce MOS-quality Si—$SiO_2$ interfaces has been hampered by slow oxidation rates (i.e. the rate of growth of the oxide layer) and poor interface quality. Both of these shortcomings may be attributed to sub-oxide formation due to the transition from SiC to stoichiometric $SiO_2$ at the SiC—$SiO_2$ interface. The oxidation rate may be increased by performing the oxidation at a high temperature (e.g. 1200° C. or greater). However, high temperature oxidation may be expensive and may cause unwanted impurities to be introduced into the growing $SiO_2$ layer, which may result in the presence of unwanted fixed oxide charges in the $SiO_2$ layer. Some of the interface disorder that may result from oxidation using molecular oxygen may be passivated by annealing the oxide in a nitrogen containing atmosphere (NO, $N_2O$, and/or $NH_3$) as described above (a so-called "nitridation" anneal). However, such annealing may not completely passivate the interface disorder.

Some embodiments of the invention provide methods for oxidizing a SiC layer using atomic oxygen. Atomic oxygen may exhibit both increased reactivity at the SiC surface as well as increased mobility within the growing $SiO_2$ layer. Thus, the use of atomic oxygen to oxidize a SiC layer may result in an interface having reduced crystallographic disorder. In addition, the oxidation rate may increase as compared to oxidation using molecular oxygen. Oxidation using atomic oxygen may moreover be accomplished at lower temperatures than oxidation using molecular oxygen, which may result in the incorporation of fewer impurities in the oxide from the furnace ambient.

In addition, oxidizing a SiC layer using atomic oxygen may reduce the resulting interface disorder at the SiC—SiO$_2$ interface, and therefore reduce the density of interface states at the SiC—SiO$_2$ interface.

Embodiments of the present invention will now be described with reference to FIGS. 1A-1C which are flow charts illustrating operations according to some embodiments of the present invention which utilize atomic oxygen to grow an oxide layer on a silicon carbide layer. Turning to FIG. 1A, a silicon carbide layer is placed in a chamber (block 52). The chamber may be a quartz tube capable of withstanding temperatures in excess of 500° C. Accordingly, the chamber may act as an oxidation furnace. The SiC layer may be a SiC substrate and/or a SiC epitaxial layer formed on a homo- or heteroepitaxial substrate. In particular embodiments, the SiC layer is a single crystal, bulk or epitaxial layer of 4H-SiC and/or 6H-SiC. In some embodiments, the chamber is configured to accommodate multiple SiC layers. For example, the chamber may be configured to receive multiple SiC wafers and/or multiple wafers on which SiC layers are formed. The chamber may be heated to a temperature of from about 500° C. to about 1300° C. (block 54). In some embodiments, the atmosphere within the chamber may be heated to a temperature of from about 500° C. to about 1300° C.

Next, atomic oxygen is introduced into the chamber (block 56). The atomic oxygen is then flowed over the SiC layer (block 58), resulting in the formation of a SiO$_2$ layer on the SiC layer.

Figure 1B:
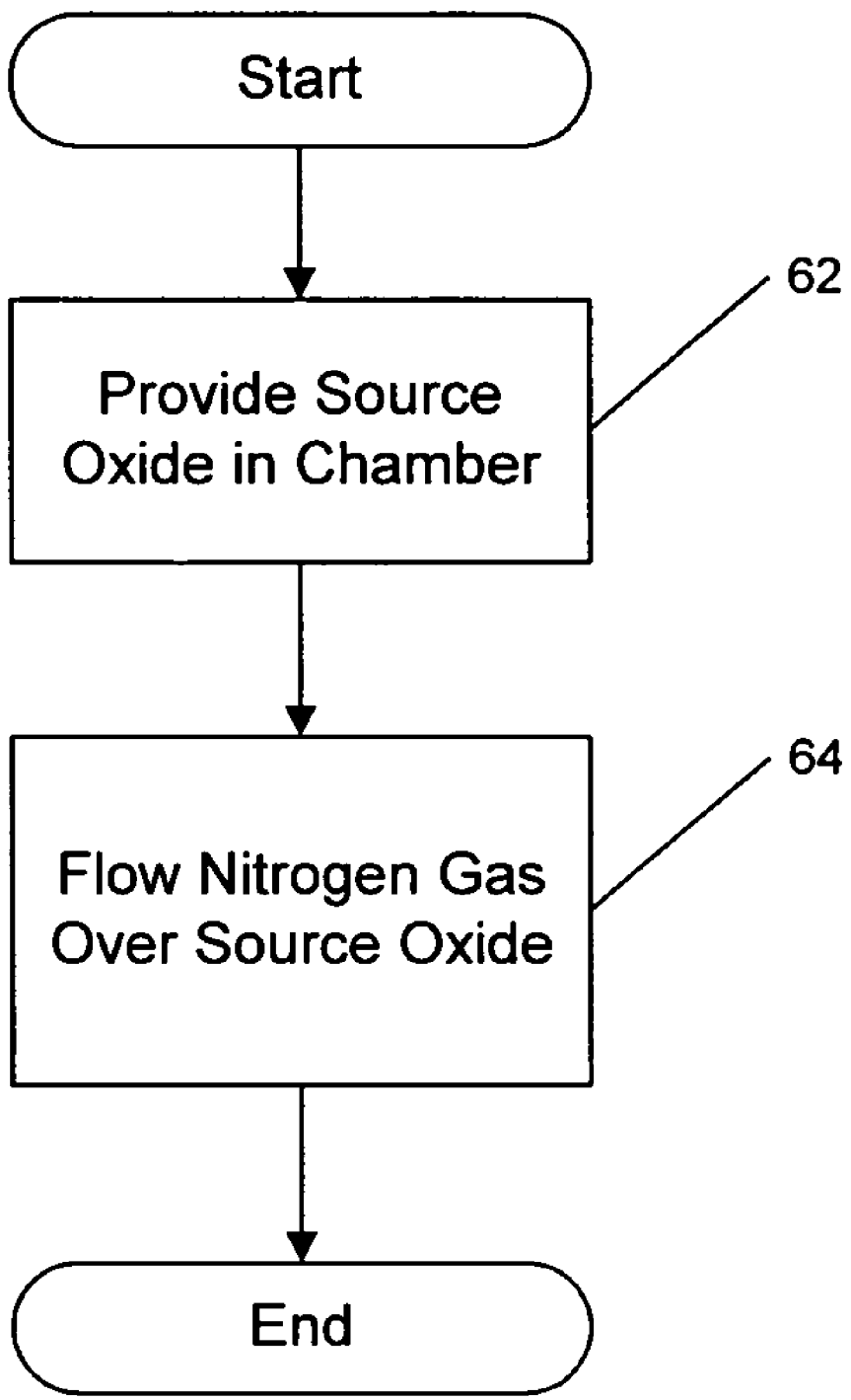

As illustrated in FIG. 1B, introducing atomic oxygen in the chamber may include providing a source oxide such as aluminum oxide within or outside the chamber (block 62) and nitriding the aluminum oxide to liberate atomic oxygen (block 64). The source oxide may be provided in a number of different forms. For example, the source oxide may include a sapphire wafer or a sintered alumina wafer. In some embodiments, the source oxide may include a porous sapphire wafer. Polished, non-porous sapphire wafers have been found not to produce a sufficient amount of atomic oxygen to support an oxidation process. While not fully understood, it is presently believed that polished, non-porous sapphire wafers have comparatively little surface area that may be nitrided. Providing a porous sapphire wafer may provide an increased surface area of aluminum oxide to be nitrided, which may result in the liberation of a larger quantity of oxygen than that which may be obtained using a non-porous sapphire wafer.

Nitriding the aluminum oxide may be performed by flowing nitrogen gas (N$_2$) over the aluminum oxide at a temperature of from about 500 to about 1300° C., which may be sufficient to cause the nitrogen to react with the aluminum oxide, thereby forming aluminum nitride and liberating a resulting quantity of atomic oxygen. The process may be self-limiting, since AlN formation at the surface of the aluminum oxide reduces the atomic oxygen generation process. However, this concern may be mitigated by increasing the surface area of the aluminum oxide.

Other methods of introducing atomic oxygen may be employed. For example, molecular oxygen may be dissociated within the chamber or upstream from the chamber, to provide atomic oxygen. For example, ozone (O$_3$) may be provided within the chamber or upstream from the chamber. The ozone may be dissociated within the chamber due to the elevated temperature within the chamber, to provide atomic oxygen. Alternatively, molecular oxygen may be dissociated upstream from the chamber and the resulting atomic oxygen introduced into the chamber. However, it is presently believed that the mean free path of atomic oxygen is such that, if produced outside the chamber, at least some of the atomic oxygen would substantially react with other atomic oxygen before it could be used to grow an oxide layer. Thus, in some embodiments, the atomic oxygen may be generated within the chamber.

In some embodiments, atomic oxygen may be generated, e.g. by dissociating molecular oxygen or by nitriding aluminum oxide, at a location (either within or outside the chamber) that is spaced away from the SiC layer to be oxidized. For example, in some embodiments the atomic oxygen may be generated at a location that is farther from the silicon carbide layer than the mean free path of atomic oxygen in the chamber. Molecular oxygen gas (O$_2$) may be provided at a temperature of from about 500° C. to about 1300° C. such that the atomic oxygen may react with the molecular oxygen gas to produce ozone. The resulting ozone, which may have a larger mean free path than atomic oxygen, may be flowed across the SiC substrate at a temperature of from about 500° C. to about 1300° C. sufficient to cause the ozone to dissociate ("crack"), thereby producing atomic oxygen which may oxidize the SiC layer.

Figure 1C:
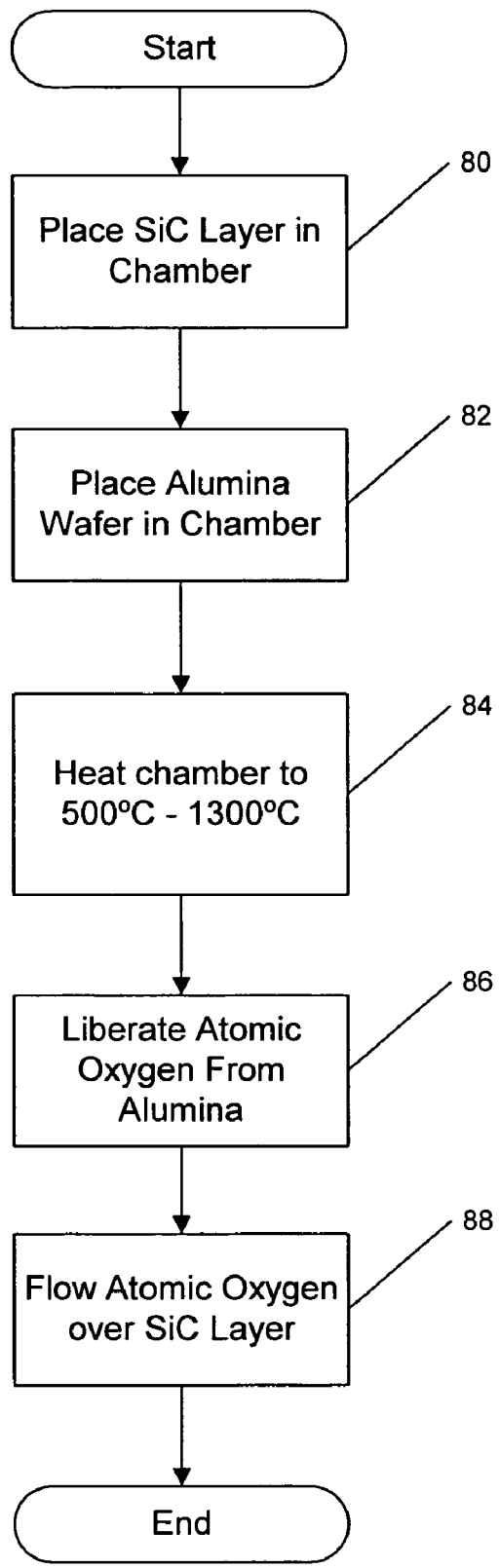

FIG. 1C illustrates methods according to further embodiments of the invention. As illustrated in FIG. 1C, a SiC layer is placed into a chamber (block 70). An alumina wafer is placed into the chamber in proximity to the SiC layer (block 72). The atmosphere within the chamber is heated to a temperature of from 500° C. to 1300° C. (block 74). Next, the alumina wafer may be nitrided to generate atomic oxygen (block 76). For example, nitrogen gas heated to a temperature of from 1000° C. to 1300° C. may be flowed over the alumina wafer to liberate atomic oxygen from the alumina wafer. The atomic oxygen is then flowed over the SiC layer to produce a SiO$_2$ layer on the SiC layer (block 78). In some embodiments, oxygen gas may be flowed over the alumina wafer to form ozone in the manner described above. The ozone may be flowed across the SiC wafer, where it may crack, thereby producing atomic oxygen in the vicinity of the SiC layer which may oxidize the SiC layer.

Figure 2:
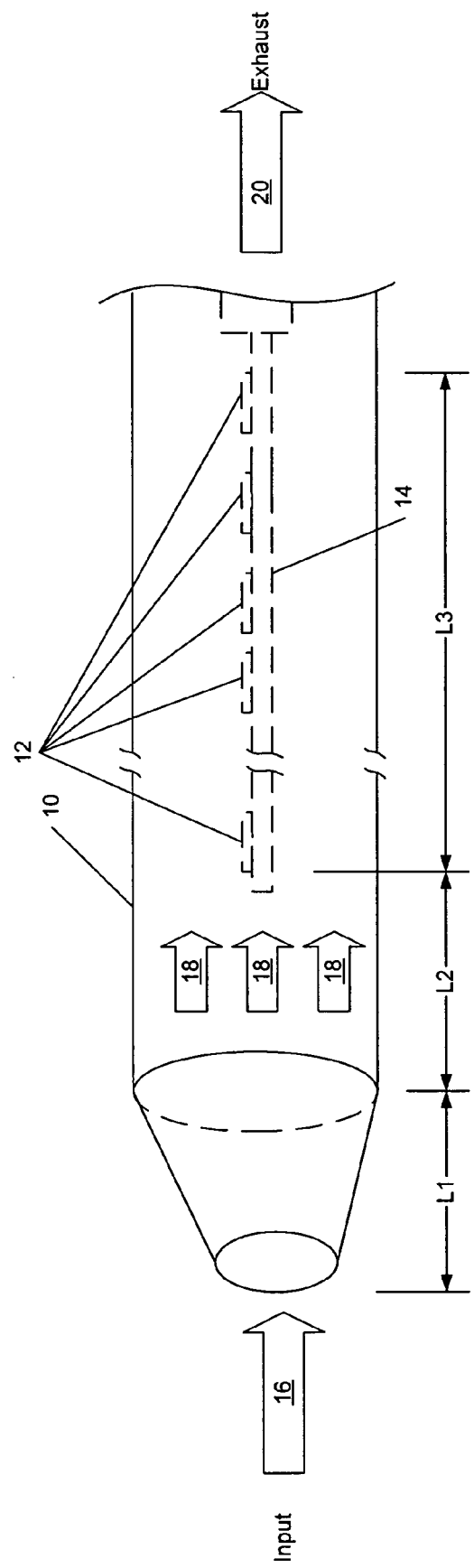
FIG. 2 is a schematic illustration of a furnace tube suitable for use in embodiments of the present invention.

FIG. 2 is an illustration of a furnace tube suitable for use in particular embodiments of the present invention. As seen in FIG. 2, the chamber 10, which may be a furnace tube, has a plurality of wafers 12 including SiC layers on which an oxide layer is to be formed. Preferably, the SiC layers are 4H-SiC. The wafers 12 are placed on a carrier 14 such that the wafers will, typically have a fixed position in the chamber 10. The carrier 14 is positioned so that the wafers are a distance L1+L2 from an inlet of the chamber 10 and extend for a distance L3 within the chamber 10. Input gases 16, which may include N$_2$, O$_2$, O$_3$, and/or inert gases, are passed into the chamber 10 and are heated as they traverse the distance L1 based on a predetermined temperature profile so as to provide the heated gases 18. The heated gases 18 may be maintained at temperatures based on the predetermined temperature profile and traverse the distance L2 to reach the first of the wafers 12. The heated gases 18 continue to pass through the chamber 10 until they leave the chamber 10 through an outlet port as exhaust gases 20. Thus, the heated gases 18 traverse the distance L3. The heated gases 18 are preferably maintained at a substantially constant temperature for the distances L2 and L3, however, as will be appreciated by those of skill in the art in light of the present disclosure, various temperature profiles may also be utilized. Such profiles may include variations in temperature over time and/or distance.

In some embodiments, the SiC layers on the wafers 12 may be oxidized using a predetermined temperature profile which includes an oxidation temperature of greater than about 500° C. in a chamber in which N$_2$ and O$_2$ are supplied at a flow rate profile within predetermined flow rate limits. Preferably, the temperature of the oxidation is about 1000° C. The flow rate limits of $N_2$ and $O_2$ may be selected based on the particular equipment in which the process is used. However, in particular embodiments, the flow rate limits of $N_2$ and $O_2$ may be as low as about 2 Standard Liters per Minute (SLM) or as high as about 180 SLM or higher. In further embodiments, flow rate limits of about 5 SLM may be preferred. The oxidation may be carried out for an amount of time dependent on the desired thickness of the oxide layer. For example, oxidation times of from a few minutes to several hours or greater may be utilized. In general, oxidation rates are higher for oxidation using atomic oxygen compared to oxidation using molecular oxygen.

As noted above, in some embodiments, atomic oxygen may be generated by nitriding a porous sapphire wafer. Single crystal sapphire wafers are commonly available as substrates for heteroepitaxial growth of compound semiconductor materials. A porous sapphire wafer may be formed by ion implantation, for example, by implanting inert species such as argon and/or nitrogen into the wafer. It may be preferable to use a porous sapphire wafer instead of alumina as a source of atomic oxygen. As discussed below, alumina may contain a number of undesirable metallic impurities that may become incorporated in the oxide. Such impurities may lead to the presence of fixed and/or mobile oxide charges which can adversely affect the operation of MOS devices. An additional advantage of using porous sapphire wafers is that after an oxidation process, the aluminum nitride layer formed on the wafer can be removed and the wafer re-used (possibly after re-implanting the wafer) as an atomic oxygen source in a subsequent oxidation process.

Other oxide materials may be used as a source of atomic oxygen in the manner described above. For example, manganese oxide may be used instead of aluminum oxide.

In some embodiments, a catalyst such as platinum may be used to assist and/or encourage the generation of atomic oxygen. The catalyst may be employed to dissociate molecular oxygen to generate atomic oxygen and/or ozone upstream from the SiC layer, either within the chamber or upstream from the chamber. The catalyst is placed between the SiC layer and the gas source such that when the gas flows over the catalyst, atomic oxygen is liberated from the gas.

Other methods of dissociating oxygen may be employed in connection with embodiments of the invention. For example, atomic oxygen may be formed through the dissociation of molecular oxygen using optical or electrical energy (e.g. exposure to UV light and/or electrostatic discharge). In addition, an oxygen plasma may be generated upstream from the chamber to form atomic oxygen and/or ozone which may be subsequently supplied to the chamber.

Figure 3:
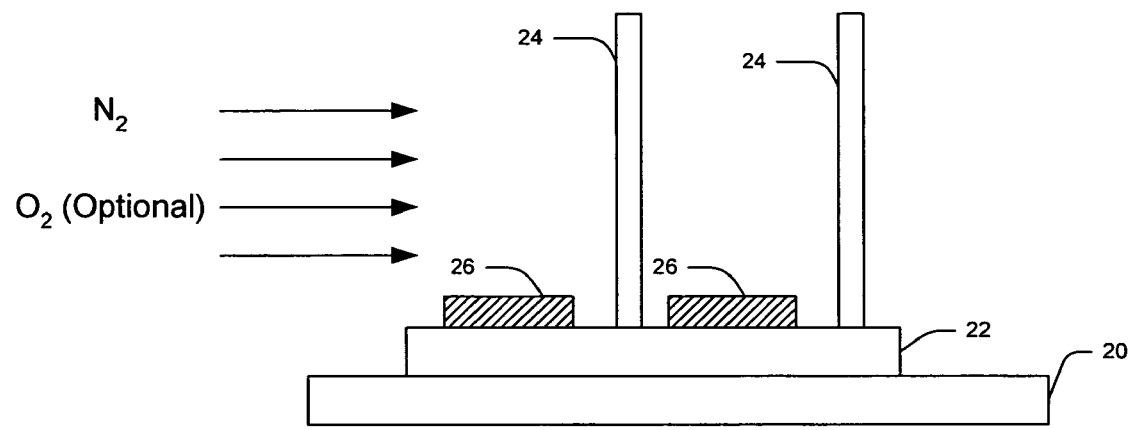
FIG. 3 is a schematic illustration of a configuration of silicon carbide wafers in a furnace tube suitable for use in embodiments of the present invention.

FIG. 3 illustrates particular configurations of SiC wafers and oxides in a chamber 10. As shown in FIG. 3, in some embodiments, a silicon carbide boat 22 may be placed on a silicon carbide paddle 20. One or more silicon carbide wafers 24 (which as discussed above may include bulk SiC wafers and/or wafers on which SiC layers have been formed) may be loaded onto the boat 22 in a vertical orientation. Alumina blocks or wafers 26 may be provided on the boat 22 between adjacent SiC wafers 24. The paddle 20 is then placed into a chamber 10, such as a quartz furnace tube. Nitrogen gas ($N_2$) and optionally oxygen gas ($O_2$) are flowed across the alumina blocks 26 and the SiC wafers 24 at a temperature of from 500° C. to 1300° C. Atomic oxygen liberated from the alumina blocks 26 oxidizes the surface of the SiC wafers 24. Although two silicon carbide wafers 24 are illustrated in FIG. 3, the number of wafers shown in the drawings is arbitrary. It will be appreciated that the number of wafers that may be processed in a chamber 10 according to embodiments of the invention will depend on factors such as the size and geometry of the chamber 10.

FIGS. 4 to 8 illustrate results which may be obtained utilizing embodiments of the present invention. Experimental results described herein are provided as examples only and shall not be viewed as limiting the present invention. Bulk 4H-SiC wafers were placed on a silicon carbide boat as illustrated in FIG. 3. Alumina wafers were positioned between adjacent SiC wafers, and the boat was placed into an oxidation chamber. The atmosphere of the chamber was heated to a temperature of 1000° C. Nitrogen and oxygen gas were flowed over the alumina substrates and the SiC wafers for 5.5 hours at which time the flow of oxygen was cut off and the flow of nitrogen was continued for 4 hours, after which the boat was removed from the chamber. An oxide was observed to have grown on the SiC wafers, and an aluminum nitride layer was observed to have formed on the alumina wafers. MOS capacitors were formed at various locations on the oxidized SiC wafers, and capacitance-voltage (C-V) measurements were taken on the resulting devices. From the C-V measurements, interface trap density and oxide thickness were calculated. For comparison, MOS capacitors were formed using conventional molecular oxidation techniques.

Figure 4A:
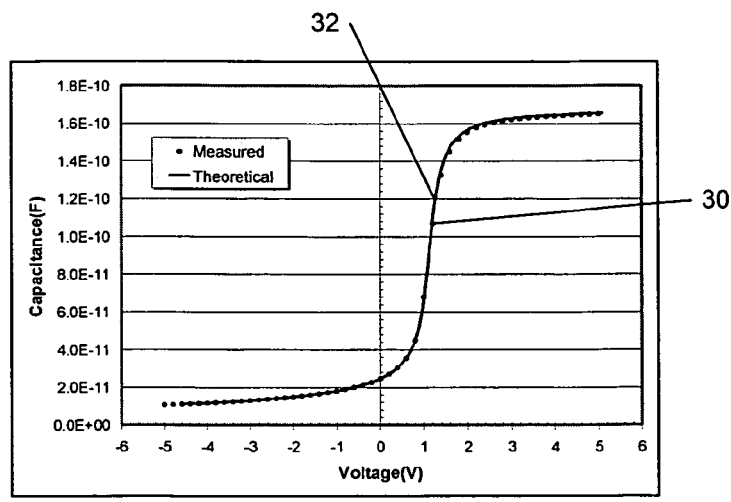
FIG. 4A is a graph of capacitance versus voltage for capacitors having an oxide formed in accordance with some embodiments of the invention.

FIG. 4A is graph of measured and theoretical capacitance vs. voltage for a capacitor fabricated using atomic oxygen according to some embodiments of the invention. As illustrated in FIG. 4A, the measured capacitance (as indicated by dots 30) was nearly coincident with the theoretical ideal curve 32. Thus, embodiments of the invention may enable the formation of SiC MOSFETs having very high inversion layer mobility due to reduced interface disorder, thereby producing power MOSFETs with substantially reduced on-resistance and LDMOSFETs with high frequency switching capability. In addition, the oxidation rate was observed to double compared to conventional molecular oxidation.

Figure 4B:
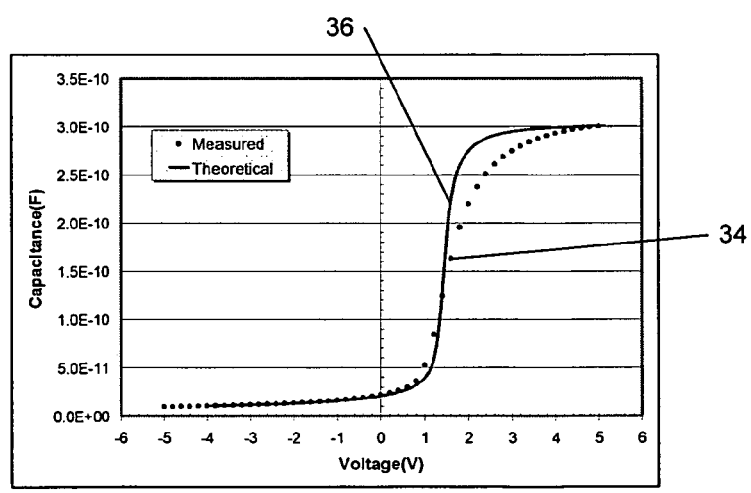
FIG. 4B is a graph of capacitance versus voltage for capacitors having an oxide formed in accordance with some conventional techniques.

For comparison, FIG. 4B illustrates C-V measurements of MOS capacitor formed using conventional molecular oxidation. As illustrated in FIG. 4B, the C-V curve of a conventional MOS capacitor (as indicated by dots 34) exhibits significant deviation from the ideal C-V curve 36.

Figure 5:
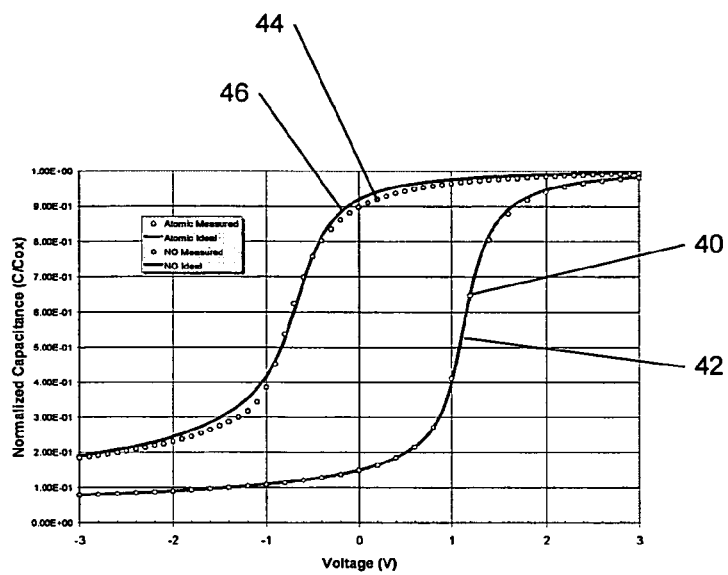
FIG. 5 is a graph of capacitance versus voltage for capacitors having an oxide formed in accordance with some embodiments of the invention as well as capacitors having an oxide formed in accordance with some conventional techniques.

Likewise, FIG. 5 is a graph of normalized capacitance ($C/C_{ox}$) vs. voltage for a MOS capacitor formed as described above and a MOS capacitor formed using some conventional molecular oxidation techniques. For the data illustrated in FIG. 5, the conventional MOS capacitor was additionally annealed in a NO environment for two hours at 1300° C. to improve the SiC—$SiO_2$ interface quality. As illustrated in FIG. 5, the measured capacitance values for the $SiO_2$ layers formed using atomic oxygen (dots 40) are almost coincident with the ideal curve (line 42), which may indicate that the amount of crystallographic disorder at the SiC—$SiO_2$ interface is low. The measured capacitance for the NO-annealed $SiO_2$ layers formed using molecular oxygen (dots 44) shows significant stretch-out as compared to the ideal curve (line 46), indicating that interface traps are present. In particular, the NO-annealed oxide produced lateral MOSFETs with channel mobility of 50 $cm^2$/V-s, which is limited by near conduction band states causing a stretch out in the C-V curve in the flatband to accumulation range. The atomic oxygen C-V data (dots 40) show almost no detectable stretch-out in this region. Assuming negligible interface trapping, the channel mobility is expected to increase up to 150 $cm^2$/V-s for lateral MOSFETs fabricated with gate oxides grown in the presence of atomic oxygen.

Figure 6:
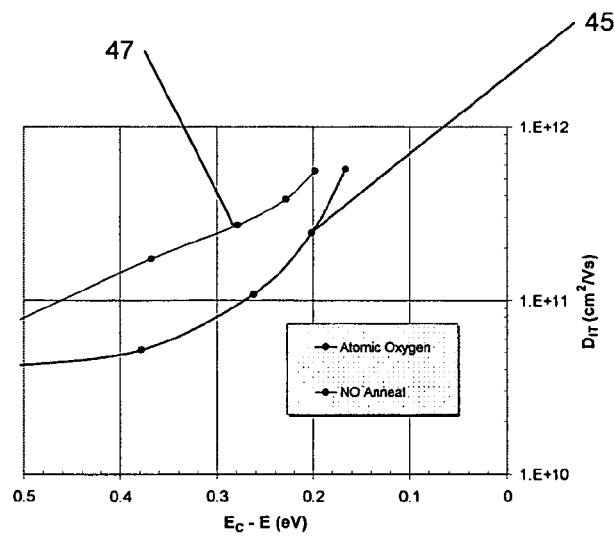
FIG. 6 is a graph of $D_{IT}$ versus energy level from the conduction band for capacitors having an oxide formed in accordance with embodiments of the invention as well as capacitors having an oxide formed in accordance with some conventional techniques.

FIG. 6 is a graph of interface state density ($D_{IT}$) versus position within the conduction band ($E_C$-E) for SiC—$SiO_2$ interfaces formed using molecular oxygen and atomic oxygen. As shown in FIG. 6, the interface state density of SiC—SiO$_2$ interfaces formed using atomic oxygen (dots 45) is significantly reduced compared to that of SiC—SiO$_2$ interfaces formed using molecular oxygen (dots 47).

Figure 7:
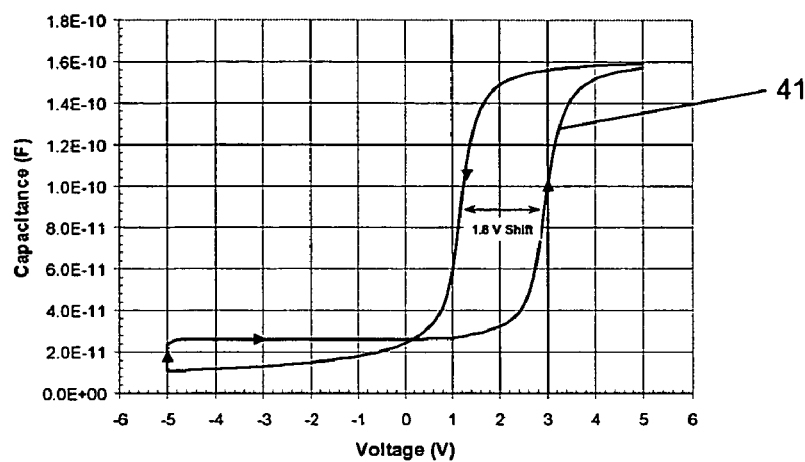
FIG. 7 is a graph of capacitance versus voltage for capacitors having an oxide formed in accordance with some embodiments of the invention.
Figure 8:
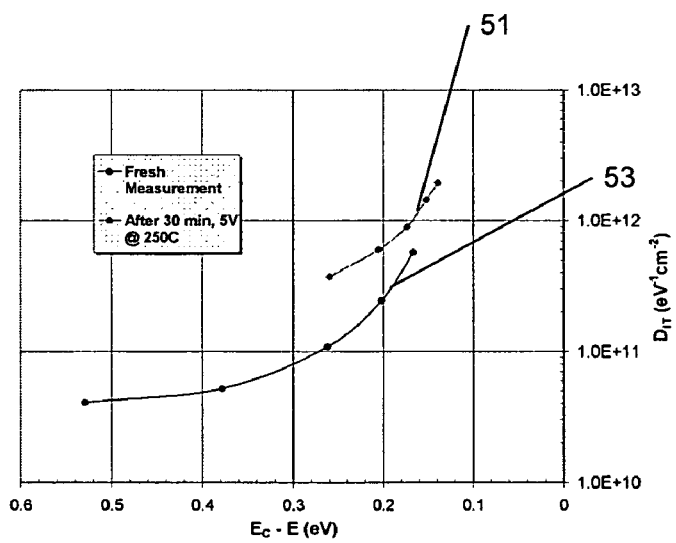
FIG. 8 is a graph of $D_{IT}$ versus energy level from the conduction band for capacitors having an oxide formed in accordance with some embodiments of the invention.

One problem with the use of alumina wafers as a source of atomic oxygen is the presence of impurities in the wafers. These impurities may become embedded in the oxide and may result in fixed or mobile charges being present in the oxide which may affect operation of MOS devices. For example, fixed and/or mobile oxide charge may cause a voltage shift in the C-V characteristics of the device due to charges moving and or states trapping an de-trapping. For example, as shown in FIG. 7, a hysteresis loop may be present in the C-V curve 41 as the applied voltage is cycled from high to low and back to high. The presence of such a hysteresis may indicate a voltage threshold instability in actual devices. In addition, a MOS interface formed using alumina may have temperature stability concerns. As illustrated in FIG. 8, after a biased heat treatment of 200° C., the measured interface trap density $D_{IT}$ tends to shift upwards (line 51), indicating an increase in the concentration of interface traps from the measurements taken before heat treatment (line 53). Finally, the oxide thickness of oxide layers grown according to the embodiments illustrated in connection with FIG. 3 may vary with location on the SiC wafer 24. For example, oxide thicknesses of 450 Å were measured at locations on a wafer that were close to the alumina wafers within the chamber 10, while oxide thicknesses of 300 Å, 270 Å and 200 Å were measured at locations on the wafer moving sequentially away from the alumina wafers.

Figure 9:
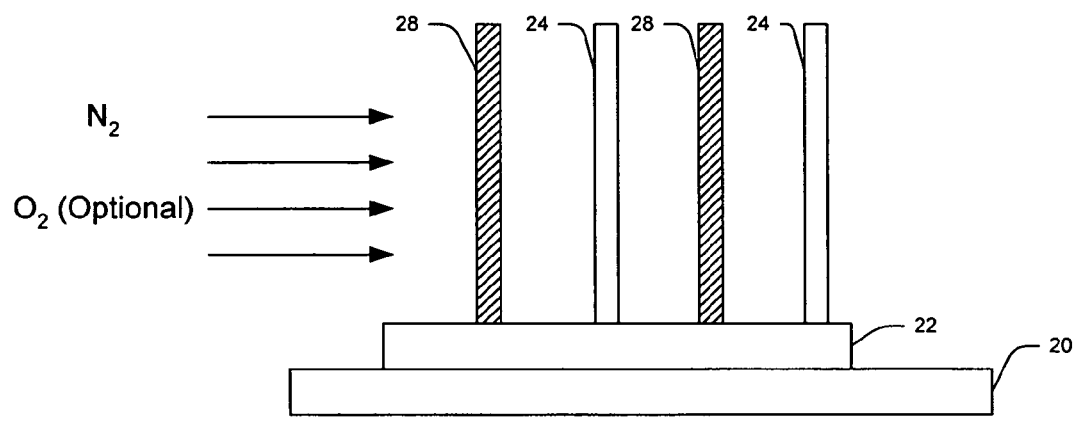
FIGS. 9 and 10 are a schematic illustrations of configurations of silicon carbide wafers in a furnace tube suitable for use in further embodiments of the present invention.

FIG. 9 illustrates further configurations of SiC wafers and oxides in a chamber 10 which may overcome some of the limitations described above. As shown in FIG. 9, a silicon carbide boat 22 may be placed on a silicon carbide paddle 20. One or more silicon carbide wafers 24 may be loaded onto the boat 22 in a vertical orientation. Alumina wafers 28 may be provided on the boat 22 in a vertical orientation between adjacent SiC wafers 24. The paddle 20 is then placed into a chamber 10, such as a quartz furnace tube. Nitrogen gas (N$_2$) and optionally oxygen gas (O$_2$) are flowed across the alumina wafers 28 and the SiC wafers 24 at a temperature of from 500° C. to 1300° C. Atomic oxygen liberated from the alumina wafers 28 oxidizes the surface of the SiC wafers 24. In these embodiments, since the alumina wafers 28 are oriented in a vertical direction parallel to the orientation of the silicon carbide wafers such that a substantially uniform distance between the alumina wafers 28 and the SiC wafers 24 is provided, the resulting oxide uniformity may be improved. Stated differently, the silicon carbide wafers 24 and the alumina wafers 28 are arranged such that the major surfaces of respective alumina wafers 28 are oriented parallel to the silicon carbide wafers 26, such that respective points on the surface of a silicon carbide wafer 26 are located equidistant from respective points on the major surface of an adjacent alumina wafer 28.

Figure 10:
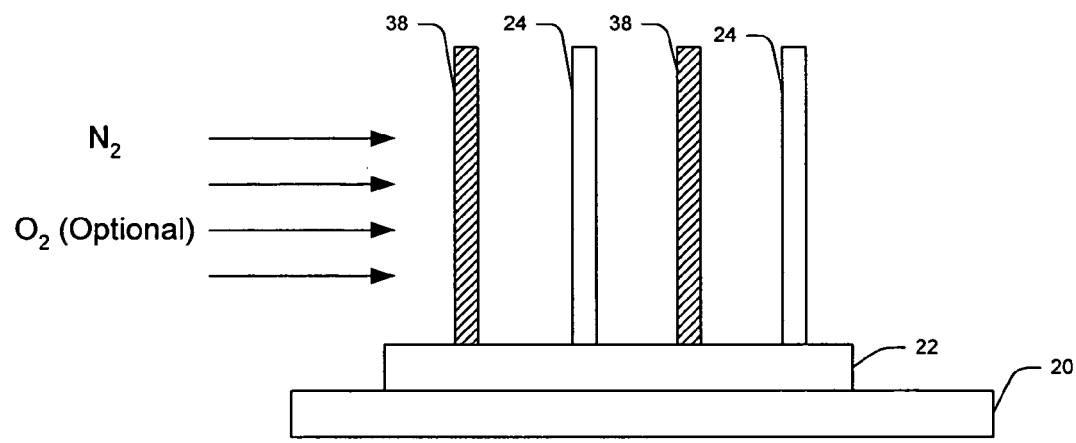

FIG. 10 illustrates further configurations of SiC wafers and oxides in a chamber 10 which may overcome some of the limitations described above. As shown in FIG. 10, a silicon carbide boat 22 may be placed on a silicon carbide paddle 20. One or more silicon carbide wafers 24 may be loaded onto the boat 22 in a vertical orientation. Porous sapphire wafers 38 may be provided on the boat 22 in a vertical orientation between adjacent SiC wafers 24. The paddle 20 is then placed into a chamber 10, such as a quartz furnace tube. Nitrogen gas (N$_2$) and optionally oxygen gas (O$_2$) are flowed across the porous sapphire wafers 38 and the SiC wafers 24 at a temperature of from 500° C. to 1300° C. Atomic oxygen liberated from the porous sapphire wafers 38 oxidizes the surface of the SiC wafers 24. In these embodiments, since the porous sapphire wafer may have a high purity, the chamber 10 may be substantially free of metallic impurities that may become incorporated into the SiO$_2$ layer. As used herein, "substantially free of metallic impurities" means that the resulting SiO$_2$ layer may have a dose of metallic impurities therein that is about two orders of magnitude or more lower than the interface state density $D_{IT}$ of the SiC/SiO$_2$ interface, i.e. less than about $10^{10}$ cm$^{-2}$. Other methods of providing atomic oxygen, such as the dissociation of ozone, may also result in an oxidation chamber 10 being substantially free of metallic impurities. In addition, since the sapphire wafers 38 are oriented in a vertical direction such that a constant distance between the sapphire wafers 38 and the SiC wafers 24 is provided, the resulting oxide uniformity may be improved.

Figure 11:
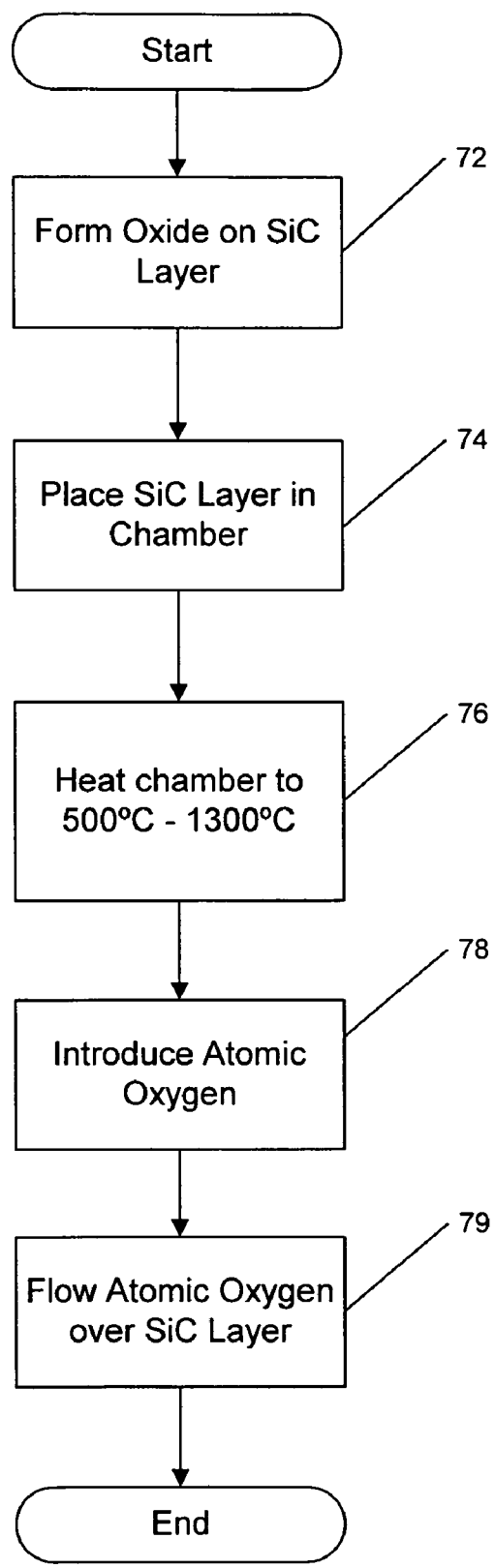
FIG. 11 is a flowchart illustrating processing steps for forming oxide layers on silicon carbide layers according to embodiments of the present invention.

Further embodiments of the invention include forming a SiO$_2$ layer on a SiC layer according to conventional techniques and annealing the formed SiO$_2$ layer in an ambient containing atomic oxygen. For example, methods of forming an oxide layer on a silicon carbide layer according to some embodiments of the invention are illustrated in FIG. 11. As shown therein, methods according to some embodiments of the invention include forming an oxide layer on a silicon carbide layer (block 72), placing the silicon carbide layer with the oxide layer formed thereon in a chamber substantially free of metallic impurities (block 74); heating an atmosphere of the chamber to a temperature of about 500 ° C. to about 1300 ° C. (block 76); introducing atomic oxygen in the chamber (block 78), and flowing the atomic oxygen over a surface of the silicon carbide layer with the oxide layer formed thereon (block 79). The oxide layer may be formed by a thermal process and/or a deposition process.

Introducing atomic oxygen may include providing a source oxide in the chamber and flowing a mixture of nitrogen and oxygen gas over the source oxide. The source oxide may include aluminum oxide or another oxide such as manganese oxide. In some embodiments, the source oxide is substantially free of metallic impurities. For example, the source oxide may include a porous sapphire wafer. In such case, some embodiments according to the invention include implanting a sapphire wafer with non-metallic impurities to form a porous sapphire wafer, and placing the porous sapphire wafer in the chamber.

In some embodiments, introducing atomic oxygen includes generating atomic oxygen using a catalyst such as platinum. In some embodiments, introducing atomic oxygen includes generating a flow of ozone and cracking the ozone to produce atomic oxygen. Ozone may be cracked using thermal and/or electromagnetic energy.

In some embodiments, atomic oxygen may be generated outside the chamber and supplied to the chamber.

In particular embodiments, the atmosphere of the chamber may be heated to a temperature of about 1000° C. to 1100° C.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:
1. A method of forming an oxide layer on a silicon carbide layer, comprising:
  placing a silicon carbide layer in a chamber substantially free of metallic impurities;

heating an atmosphere of the chamber to a temperature of about 500° C. to about 1300° C.;

introducing atomic oxygen in the chamber, wherein introducing atomic oxygen comprises providing a source oxide in the chamber and flowing nitrogen gas over the source oxide under conditions selected to liberate atomic oxygen from the source oxide; and flowing the atomic oxygen over a surface of the silicon carbide layer to thereby form an oxide layer on the silicon carbide layer.

2. The method of claim 1, wherein the source oxide comprises aluminum oxide.

3. The method of claim 1, wherein the source oxide comprises manganese oxide.

4. The method of claim 1, wherein the source oxide is substantially free of metallic impurities.

5. The method of claim 1, wherein the source oxide comprises a porous sapphire wafer.

6. The method of claim 1, further comprising:

implanting a sapphire wafer with non-metallic impurities to form a porous sapphire wafer; and placing the porous sapphire wafer in the chamber, wherein the porous sapphire wafer comprises the source oxide.

7. The method of claim 1, wherein the chamber comprises an oxidation furnace tube.

8. The method of claim 1, wherein heating an atmosphere of the chamber comprises heating an atmosphere of the chamber to a temperature of about 1000° C. to about 1100° C.

9. A method of forming an oxide layer on a silicon carbide layer, comprising:

forming an oxide layer on a silicon carbide layer;

placing the silicon carbide layer with the oxide layer thereon in a chamber substantially free of metallic impurities;

heating an atmosphere of the chamber to a temperature of about 500° C. to about 1300° C.;

introducing atomic oxygen in the chamber, wherein introducing atomic oxygen comprises providing a source oxide in the chamber; and flowing nitrogen gas over the source oxide under conditions selected to liberate atomic oxygen from the source oxide; and flowing the atomic oxygen over a surface of the silicon carbide layer.

10. The method of claim 9, wherein the source oxide comprises aluminum oxide.

11. The method of claim 9, wherein the source oxide comprises manganese oxide.

12. The method of claim 9, wherein the source oxide is substantially free of metallic impurities.

13. The method of claim 9, wherein the source oxide comprises a porous sapphire wafer.

14. The method of claim 9, further comprising:

implanting a sapphire wafer with non-metallic impurities to form a porous sapphire wafer; and placing the porous sapphire wafer in the chamber, wherein the porous sapphire wafer comprises the source oxide.

15. The method of claim 9, wherein the chamber comprises an oxidation furnace tube.

16. The method of claim 9, wherein heating an atmosphere of the chamber comprises heating an atmosphere of the chamber to a temperature of about 1000° C. to about 1100° C.

17. The method of claim 1, wherein flowing nitrogen gas over the source oxide further comprises nitriding the source oxide to form a nitrided source oxide.

* * * * *

UNITED STATES PATENT AND TRADEMARK OFFICE
CERTIFICATE OF CORRECTION

PATENT NO. : 7,572,741 B2
APPLICATION NO. : 11/229476
DATED : August 11, 2009
INVENTOR(S) : Das et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 825 days.

Signed and Sealed this

Seventh Day of September, 2010

David J. Kappos
*Director of the United States Patent and Trademark Office*